United States Patent [19]

Whetten

[11] Patent Number: 5,062,690

[45] Date of Patent: Nov. 5, 1991

[54] LIQUID CRYSTAL DISPLAY WITH REDUNDANT FETS AND REDUNDANT CROSSOVERS CONNECTED BY LASER-FUSIBLE LINKS

[75] Inventor: Nathan R. Whetten, Ballston Lake, N.Y.

[73] Assignee: General Electric Company, Schenectady, N.Y.

[21] Appl. No.: 373,433

[22] Filed: Jun. 30, 1989

[51] Int. Cl.$^5$ .................... G02F 1/133; H01L 29/68; G09G 3/36

[52] U.S. Cl. ......................... 359/59; 359/54; 340/784; 357/23.7

[58] Field of Search ....................... 365/65, 63, 72, 45, 365/231; 350/333, 339 R, 334; 340/784; 357/23.7

[56] References Cited

U.S. PATENT DOCUMENTS

| | | | |
|---|---|---|---|
| 4,368,523 | 1/1983 | Kawate | 365/63 |
| 4,666,252 | 5/1987 | Yaniu et al. | 350/333 |
| 4,853,755 | 8/1989 | Okabe et al. | 357/23.7 |
| 4,853,758 | 8/1989 | Fischer | 357/51 |
| 4,894,690 | 1/1990 | Okabe et al. | 357/4 |
| 4,917,467 | 4/1990 | Chen et al. | 352/332 |

Primary Examiner—Stanley D. Miller
Assistant Examiner—Ron Trice
Attorney, Agent, or Firm—Marvin Snyder; James C. Davis, Jr.

[57] ABSTRACT

Each cell of a liquid crystal display comprises a pixel electrode, a primary field effect transistor for transferring electrical signals from one scan line and one data line to the pixel for conversion to an optical signal and at least one auxiliary field effect transistor for transferring signals from a scan line adjacent to the one scan line and from the one data line to the pixel when the primary field effect transistor is defective. The auxiliary FET gate electrode is electrically isolated from the adjacent scan line when the primary FET is not defective and may be connected to the adjacent scan line by activating a laser-fusible link if the primary FET is defective. Redundant scan line crossovers and redundant data line crossover are provided, with each redundant crossover having an open circuit that may be closed by a laser-fusible link to create a shunt around a selected scan and data line crossover location, if the scan line and data line are shorted together at that crossover location.

14 Claims, 10 Drawing Sheets

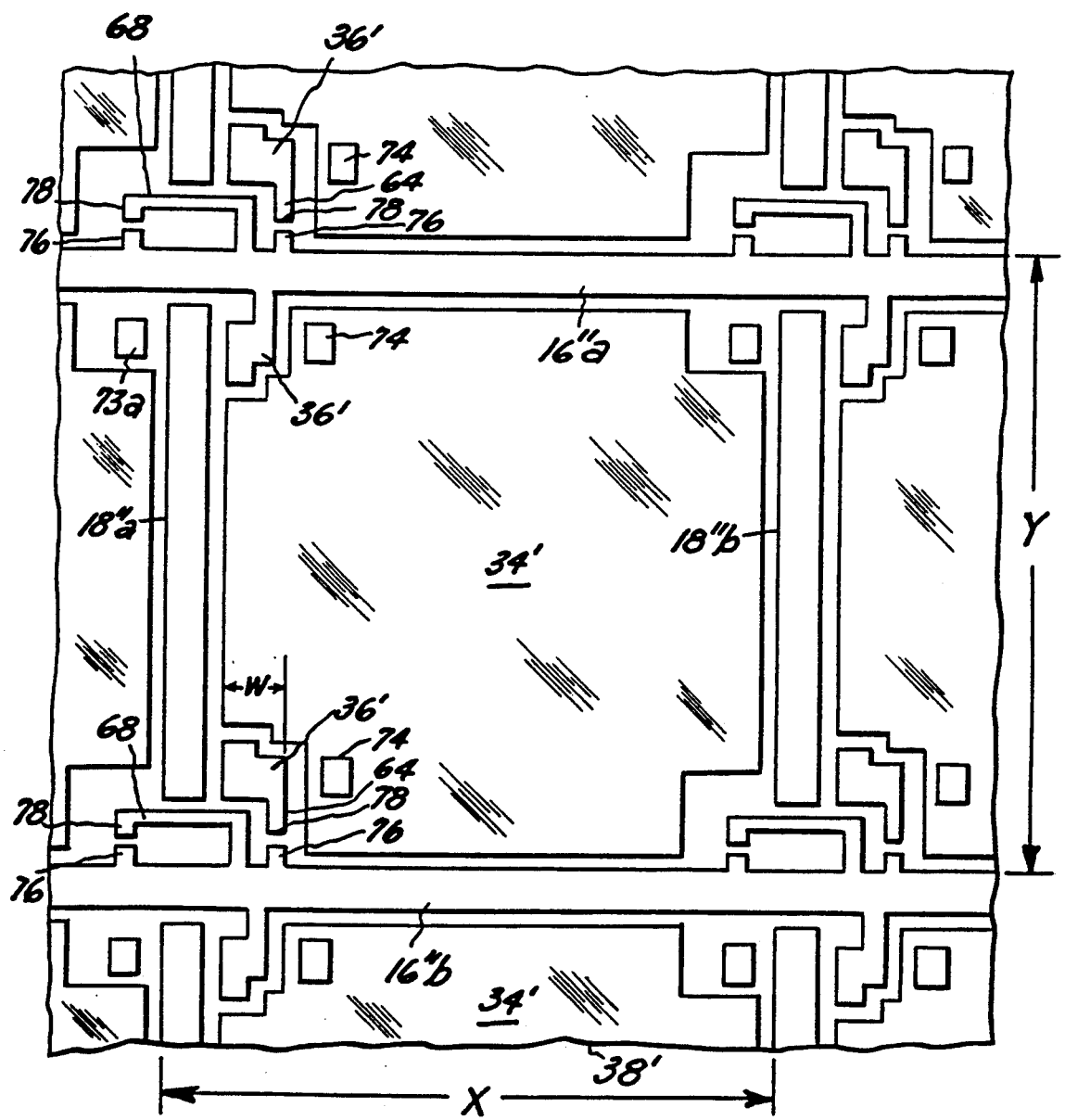

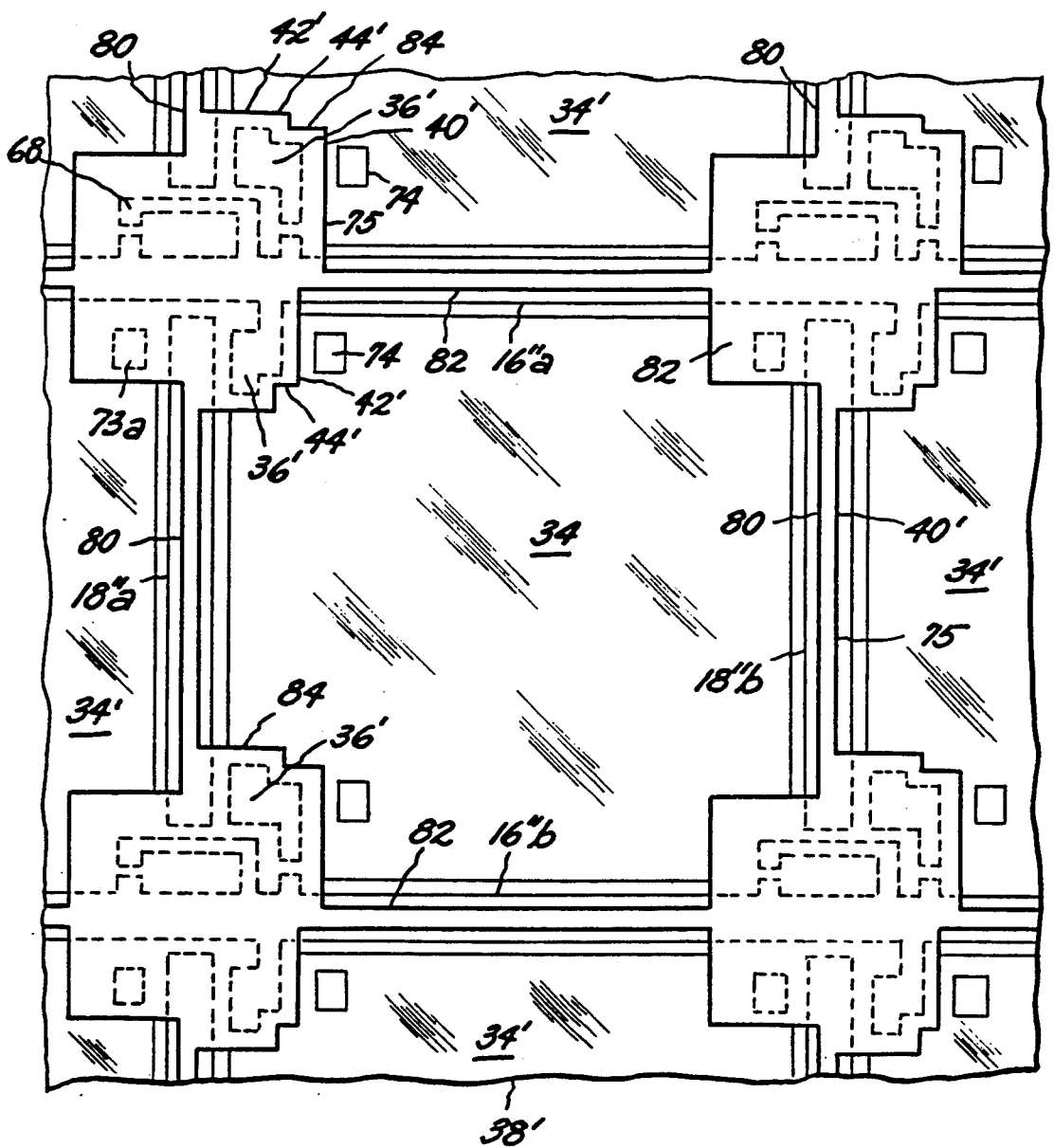

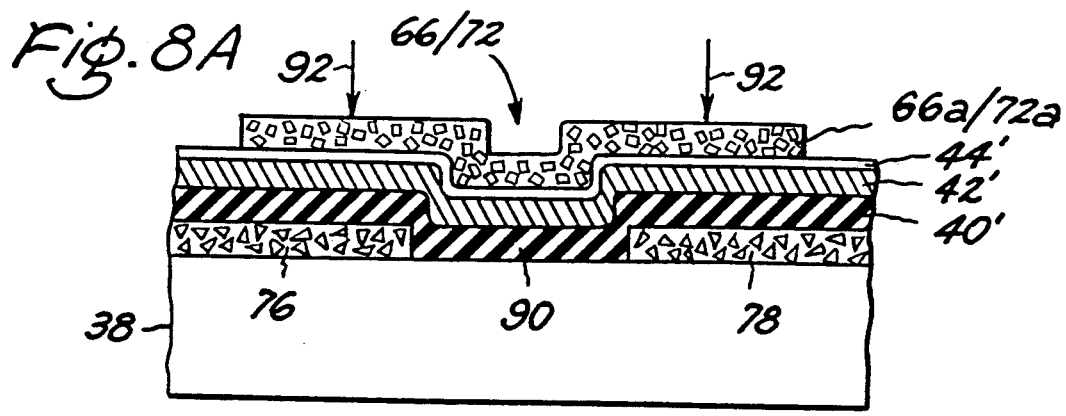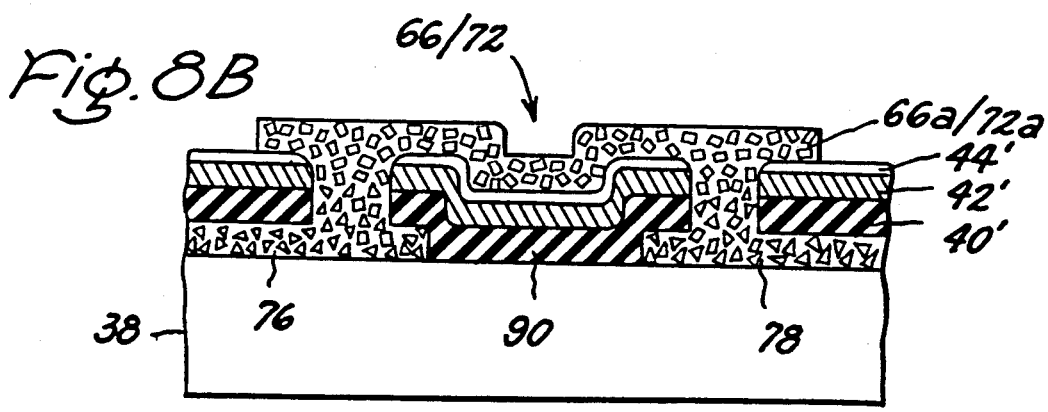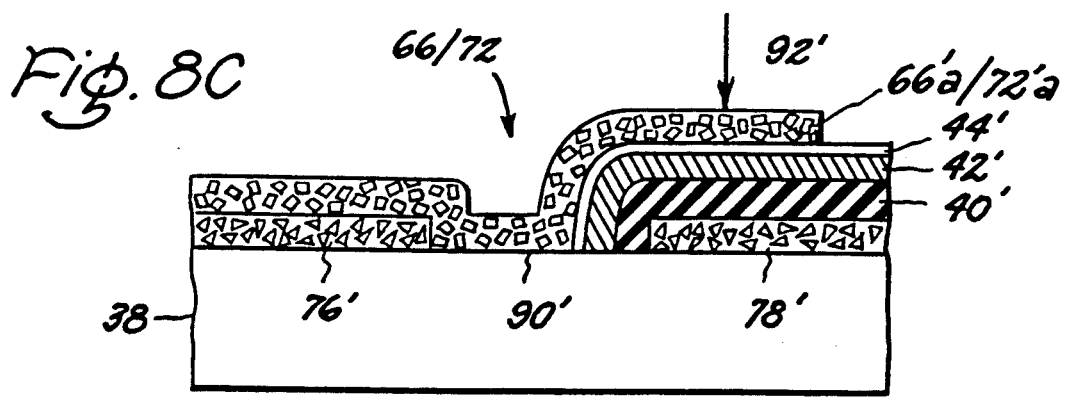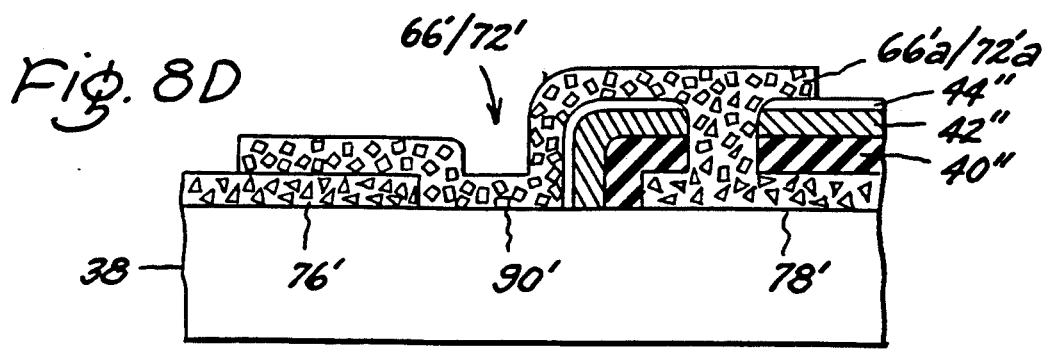

LIQUID CRYSTAL DISPLAY WITH REDUNDANT FETS AND REDUNDANT CROSSOVERS CONNECTED BY LASER-FUSIBLE LINKS

BACKGROUND OF THE INVENTION

The present invention relates to liquid crystal displays (LCD) and, more particularly, to a novel liquid crystal display comprising a plurality of cells, or pixels (picture elements), with each cell having a redundant field-effect transistor (FET) and a redundant crossover structure for the pixel address lines, both connected by laser-fusible links to the display.

A liquid crystal display device typically comprises a pair of flat panels (usually a glass substrate and a cover glass) sealably containing a quantity of liquid crystal material, such as a dichroic dye guest/host system or a twisted nematic formulation. One of the flat panels will usually have conductive material disposed on, and substantially completely covering, an inner surface to form a "ground plane" electrode. A plurality of electrodes, formed from a transparent conductive material such as indium tin oxide (ITO), will be disposed on the opposite panel and will usually be arranged in uniform columns and rows to form an X-Y matrix structure. These electrodes are generally referred to as "pixel" electrodes. Thus, in a liquid crystal display a typical cell or pixel includes liquid crystal material disposed between a pixel electrode and a ground electrode, which effectively forms a capacitor disposed between the two flat panels. If the liquid crystal display is to operate by reflected light, as in a digital watch or calculator display, only the opposite panel (on which the ITO electrodes are disposed) need be transparent; the other panel will be formed with a reflective surface. If the liquid crystal display is to be light transmissive, then both flat panels should be transparent and the ground plane electrode should also be formed from a transparent material (such as ITO and the like).

A semiconductor switch, such as a thin-film field-effect transistor (FET) and the like, is integrally formed with each pixel to control operation of that pixel in the display. FETs are preferred in LCDs because of their potentially small size, low power consumption, favorable switching speeds, ease of fabrication, and compatibility with conventional LCD structures.

Electrical communication with the individual pixel FETs is accomplished by a plurality of X-address lines or scan lines, typically one for each row (or column) of pixels, and a plurality of Y-address lines or data lines, one for each column (or row) of pixels. The scan lines are usually connected to the gate electrodes of the pixel FETs and the data lines are usually connected to the source electrodes. The drain electrode of each FET is connected to the pixel electrode. An individual pixel may be addressed by applying a voltage of sufficient magnitude to one of the scan lines to cause the FETs in the row corresponding to the scan line to "switch-on" to a conducting state. If a data voltage is applied to a data line while an FET in the column corresponding to the data line is in an "on" state, the pixel capacitor will charge and store the data voltage after the scan line voltage has decreased to a level sufficient to turn-off the FET. Each pixel in the display may be individually addressed in this manner. Depending upon the magnitude of the data voltage applied to the pixel electrode, the optical properties of the liquid crystal material are altered. The data voltage magnitude may be such as to: allow no light transmission through the pixel (off); allow maximum light transmission through the pixel (on); or provide an intermediate gray scale level of light transmission.

Short-circuits between the data lines and scan lines (at locations where these address lines cross over one another), short-circuits within the FETs, and short-circuits between the FETs and the scan or data lines, are the major sources of defects adversely affecting operation of amorphous silicon liquid crystal displays. Shorts may also exist between the ITO of the pixel electrodes and the data and scan address lines where the ITO hasn't been completely etched away to provide a spacing between the pixel and the adjacent address lines.

The scan and data address lines are insulated from each other at their crossover locations by a thin layer of an insulation material, such as silicon nitride (SiN). The data and scan lines can short to one another at the crossover locations through holes which may inadvertently develop in the insulation layer during device fabrication. Typically, the metallization for the data and scan lines is deposited by sputtering during different process steps; therefore, the later deposited metallization will be deposited through any holes or openings in the insulation layer formed in contact with the first deposited metallization.

Defects, such as open-circuits and short-circuits, can also occur in the FET associated with a pixel. For example, a layer of SiN insulates the gate of the FET from a layer of amorphous silicon through which a conductive channel, between the source and drain regions of the FET, is enhanced when a voltage of sufficient magnitude and proper polarity is applied to the FET gate with respect to the FET source. If an opening exists in the SiN insulation layer of the FET, a conductive path may be established between the gate or scan line and the corresponding data line through the FET, which path will adversely affect operation of the pixel associated with that FET.

The problem of short-circuits within the FET may be addressed by providing a redundant or auxiliary FET for each pixel. This remedy has certain disadvantages, however: Most of the pixels may not need a second FET; and, since the second FET is at all times connected between the pixel electrode and the data and scan lines, it causes additional capacitance to be present which may reduce the speed of operation of the device because of the increased RC time constant of the data lines. This problem will become even more critical as display areas become larger; longer address lines cause the line resistance to increase and the pixel capacitor will take longer to charge. Additionally, if both FETs are connected at all times and if there is a defect in one of the two FETs, it may not be possible to identify which FET has the defect because the defect may not be visible through a microscope. Therefore, there is a risk that the good FET will be severed from the address lines, i.e., the metal lines connecting the FET to the scan and data lines will be severed by the known technique of laser evaporation, when attempting to electrically isolate the defective FET.

It is accordingly a primary object of the present invention to provide a novel LCD structure which is not subject to the foregoing disadvantages.

It is another object of the present invention to provide auxiliary FETs which are electrically isolated from the LCD so as to not affect normal operation of the LCD un
less required.

It is yet a further object of the present invention to provide redundant scan and data line crossovers which are electrically open unless otherwise required.

It is yet another object of the present invention to provide laser-fusible links, for connecting the auxiliary FETs and for closing the redundant scan and data line crossovers, which can be efficiently formed during the LCD device fabrication without excessive process steps and which can be quickly and easily activated.

These and other objects of the invention, together with the features and advantages thereof, will become apparent from the following detailed specification when read with the accompanying drawings in which like reference numerals refer to like elements.

SUMMARY OF THE INVENTION

In accordance with the present invention, each pixel of a liquid crystal display includes both a primary FET for controlling operation of the pixel, and an auxiliary FET; both FETs are integrally formed with the pixel. Both the primary FET and the auxiliary FET have a source electrode connected to a data line of the liquid crystal display and a drain electrode connected to a light transmissive electrode of the pixel. The primary FET includes a gate electrode connected to one scan line of the liquid crystal display; the auxiliary FET includes a gate electrode which may be connected to another scan line, adjacent to the one scan line to which the primary FET is connected, by a laser-fusible link if the primary FET is defective. The gate electrode of the auxiliary FET is electrically isolated from the other scan line and is only connected to the other scan line when a laser light pulse of sufficient energy and duration is incident upon the laser-fusible link. The defective primary FET gate electrode may be electrically isolated from the one scan line by severing the connection between the gate electrode and the one scan line by laser evaporation.

A liquid crystal display, having a plurality of pixels arranged in uniform columns and rows to form an X-Y matrix structure, comprises a plurality of scan lines extending substantially in one direction across the liquid crystal display and a plurality of data lines extending substantially in a direction perpendicular to the one direction of the scan lines, such that each data line crosses each scan line at a crossover location and is spaced from the scan line by a layer of insulation. In accordance with the present invention, the liquid crystal display further comprises a redundant crossover for each scan and data line at a crossover location. Each redundant crossover has an open circuit which may be closed by a laser-fusible link to create a shunt around the crossover location if the scan and data lines are shorted together at the crossover location. The crossover location may be electrically isolated from the scan and data lines by severing the scan line and the data line by laser evaporation at locations between points where the redundant crossovers connect to their respective scan and data line.

BRIEF DESCRIPTION OF THE DRAWINGS

FIGS. 7A-7C are detailed plan views of the steps employed in fabricating the present invention.

FIG. 8A is a cross-sectional view of a laser-fusible link of FIG. 7C taken along lines 8—8 in accordance with the one embodiment of the present invention.

FIG. 8B is a cross-sectional view of the laser-fusible link of FIG. 8A after treatment by a laser light pulse.

FIG. 8C is a cross-sectional view of a laser-fusible link of FIG. 7C taken along lines 8—8 in accordance with an alternate embodiment of the present invention.

FIG. 8D is a cross-sectional view of the laser-fusible link of FIG. 8C after treatment by a laser light pulse.

DETAILED DESCRIPTION OF THE PREFERRED EMBODIMENTS

Figure 1:
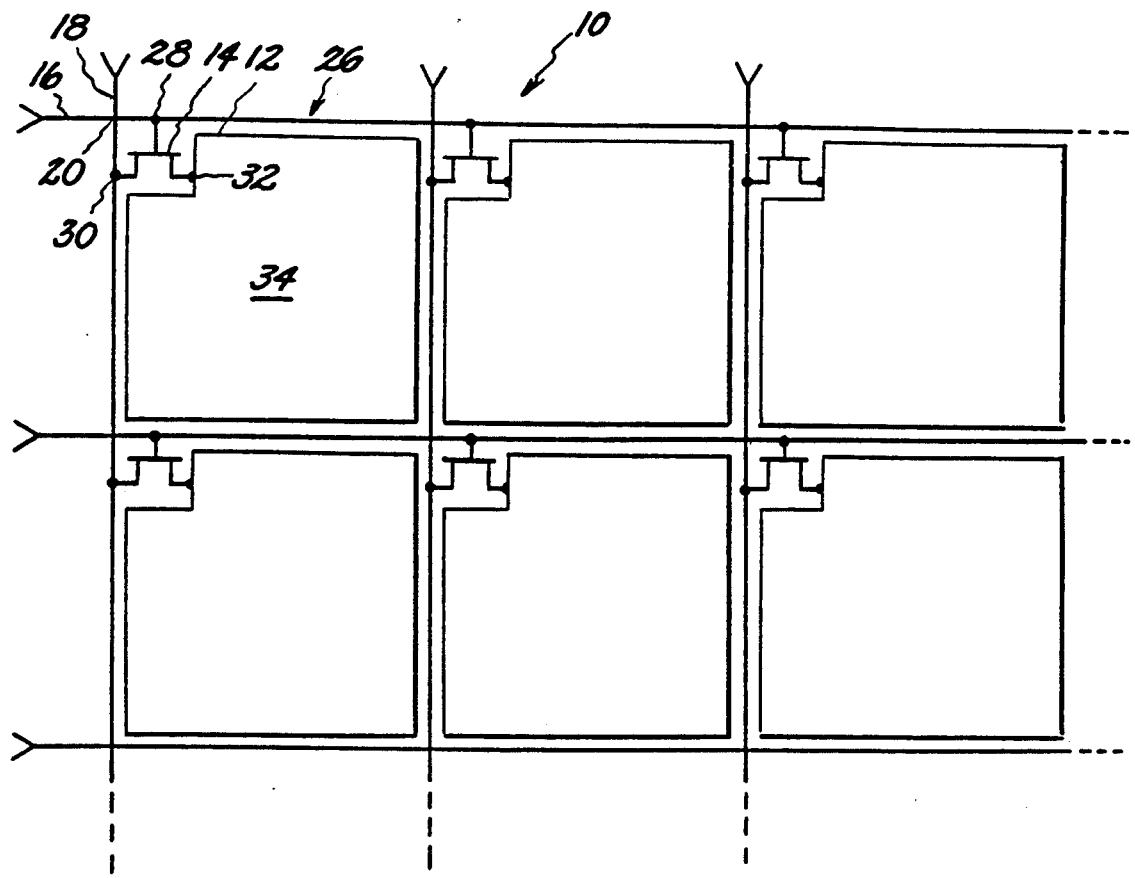
FIG. 1 is a schematic plan view of a portion of a prior art FET driven liquid crystal display.
Figure 2:
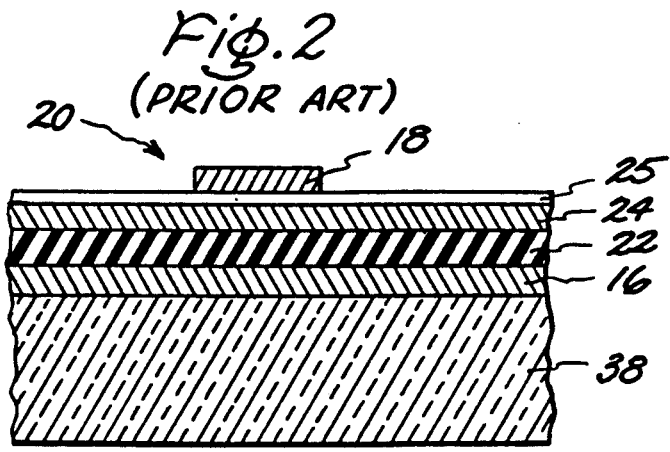
FIG. 2 is a cross-sectional view of a scan line and data line crossover of FIG. 3 taken along lines 2—2.

FIG. 1 is a schematic plan view of a portion of a liquid crystal display 10 which is formed from a plurality of picture elements or pixels 12. The pixels 12 are usually arranged in uniform columns and rows to form an X-Y matrix type structure. Conventional liquid crystal displays typically have a semiconductor switch such as a field-effect transistor (FET) 14 which is integrally formed with each pixel 12 to control operation of the light transmissive characteristics of the pixel in the liquid crystal display. Electrical signals are communicated by a plurality of X-address lines or scan lines 16 and a plurality of Y-address lines or data lines 18 to FETs 14 and pixels 12 for displaying an image. Typically, there is one scan line 16 for each row of pixels and one data line 18 for each column of pixels. Scan lines 16 usually run in one direction across the display and data lines 18 typically run in a direction substantially perpendicular to the scan lines; however, the scan and data lines may jog or snake back and forth (an undesirable arrangement) if the pixel elements are staggered. Scan lines 16 and data lines 18 traverse each other at locations 20, known as crossovers. As best shown in FIG. 2, scan lines 16 and data lines 18 are electrically isolated from each other at crossovers 20 by a layer 22 of insulation, preferably a layer of silicon nitride (SiN). Since the scan lines and data lines preferably undergo the same process steps as the FETs, which require a "sandwich" structure of SiN, amorphous silicon (a-Si) and doped a-Si, a second layer 24 of a-Si and a third layer 25 of doped a-Si may be deposited between the scan and data lines.

Figure 3:
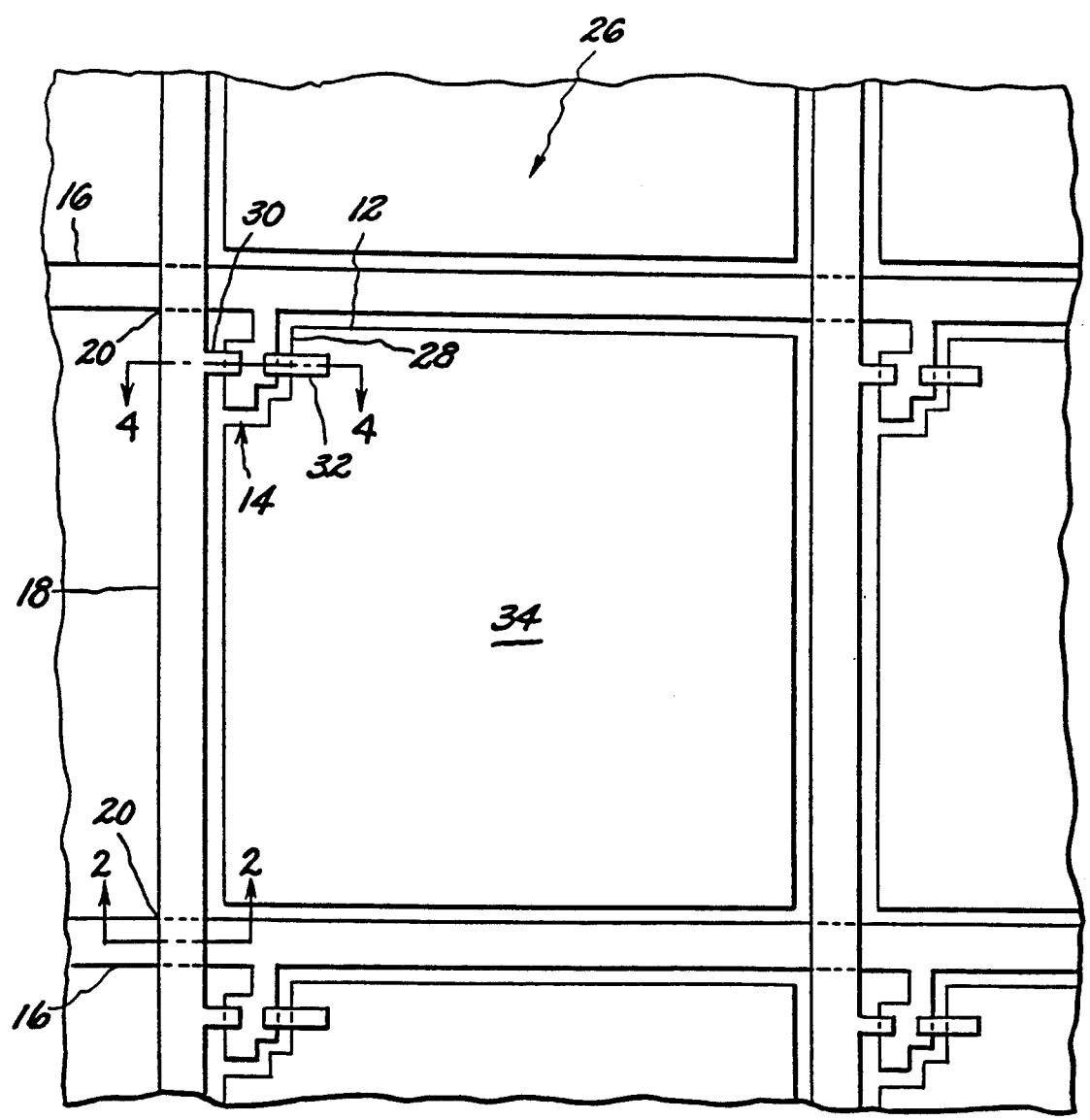
FIG. 3 is a detailed plan view of a portion of the liquid crystal display of FIG. 1.
Figure 4:
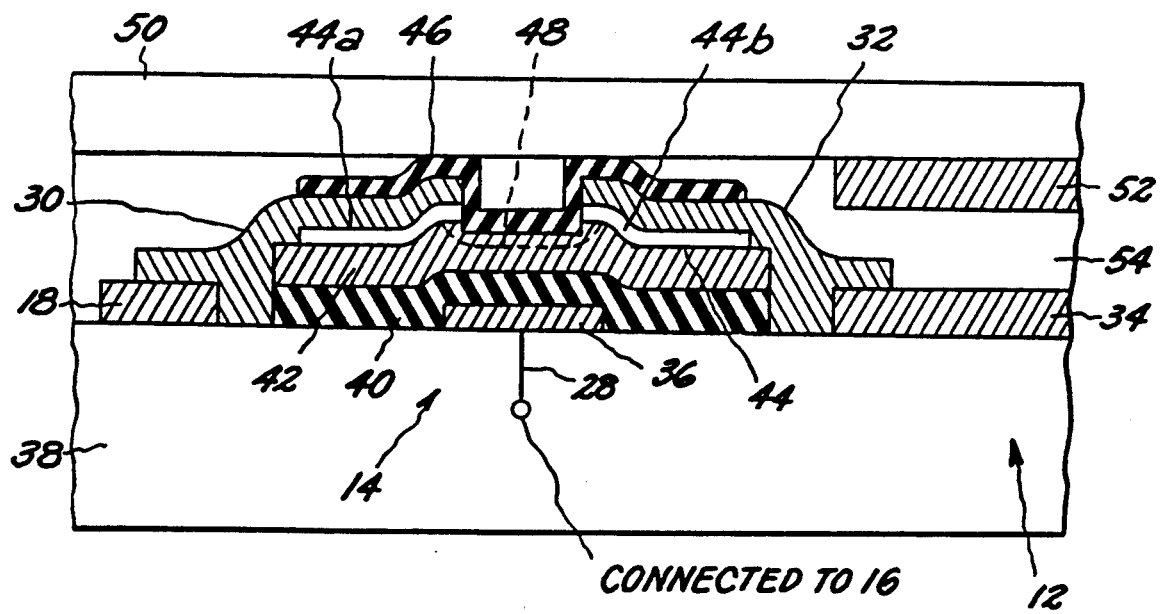
FIG. 4 is a cross-sectional view of a portion of a liquid crystal cell of FIGS. 3, 6A and 7C taken along lines 4—4.

Referring now to both FIG. 1 and FIG. 3, which is a detailed plan view of a single liquid crystal cell 26 of FIG. 1, a gate electrode 28 and a source electrode 30 of each FET 14 are respectively connected to a scan line 16 and a data line 18 for transferring electrical signals from the scan and data lines to pixel 12 for conversion to an optical signal. A drain electrode 32 of each FET 14 is connected to a pixel electrode 34 fabricated from a light transmissive material such as indium tin oxide (ITO). A cross-sectional view of FET 14 and a portion of a pixel 12 are shown in FIG. 4. A FET gate electrode 36, data line 18, and pixel electrode 34 are formed on a glass substrate 38 by known photolithographic techniques. A layer 40 of hydrogenated silicon nitride ($Si_x N_y:H$) is deposited over gate 36 and a layer 42 of hydrogenated amorphous silicon (a-Si:H) is deposited over silicon nitride layer 40. Layers 40 and 42 are then patterned as shown in FIG. 4. A heavily doped layer 44 of hydrogenated amorphous silicon is formed and patterned on layer 42 to form source region 44a and drain region 44b. The silicon nitride layer 40 and amorphous silicon layer 42 are preferably deposited in a single pump-down by plasma-enhanced chemical vapor deposition (PECVD) using $SiH_4$ with addition of $NH_3$ for fabrication of the silicon nitride layer 40. Phosphorous ($PH_3$) may be substituted for the $NH_3$ in the pump-down to form an N+ layer 44. The PECVD process is preferably conducted at a substrate temperature of about 300° C. Using a plasma instead of high temperature to decompose the gasses permits high quality films to be deposited at much lower substrate temperatures than conventional CVD. The hydrogen passivates the dangling bonds of the a-Si layers 42 and 44 to provide a high-quality semiconductor material. This low-temperature process further permits the use of a glass substrate 38.

Figure 5:
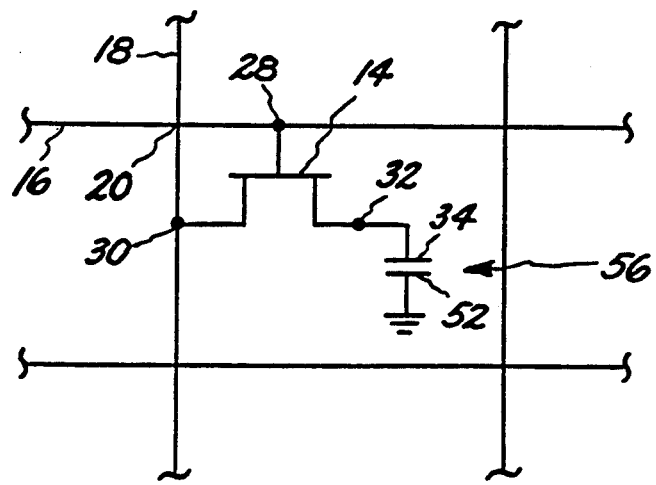
FIG. 5 is a schematic diagram of the equivalent circuit of a liquid crystal cell.

Source electrode 30 is deposited and patterned in contact with data line 18 and source region 44a; drain electrode 32 is deposited and patterned in contact with drain region 44b and pixel electrode 34. A layer 46 of light-blocking material is formed over the FET to prevent light from being absorbed in a conductive channel 48 (shown bounded by a broken line in FIG. 4) of the FET which can cause photoconductive leakage, disrupting proper operation of the pixel. A layer 50 of glass covers the liquid crystal display 10. Thus, the FET and pixel are sandwiched between glass substrate 38 and coverglass 50. A ground plane electrode 52, which is common to all pixels in liquid crystal display 10, is formed on coverglass 50 at a spacing from pixel electrode 34. The volume 54 between electrodes 34 and 52 is filled with liquid crystal material and cover glass 52 is bonded to glass substrate 38 by a seal (not shown) at the perimeter of liquid crystal display 10. As shown in the cell equivalent circuit of FIG. 5, electrodes 34 and 52 effectively form a pixel capacitor 56 connected between FET 14 and ground potential.

In operation, an individual pixel 12 may be addressed by applying a scan line voltage of proper polarity and magnitude to scan line 16 to enhance the conductive channel 48 across a-Si:H layer 42, between source region 44a and drain region 44b. If a data voltage is applied to data line 18 while the scan line voltage is present, then pixel capacitor 56 will charge while the data voltage is also present and pixel capacitor 56 will store the charge after the scan line voltage has decreased to a level sufficient to deplete conductive channel 48 and switch FET 14 to a non-conductive state. This procedure may be periodically repeated to refresh the charge on pixel capacitor 56 to maintain the image on the LCD and prevent flickering of the display; preferably, the LCD image is refreshed about 10 every ms or less. The quantity of light transmitted through pixel 12 is a function of the magnitude of the data line voltage applied to pixel electrode 34 and the charge on pixel capacitor 56. One often-encountered problem is that the silicon nitride layer 40 is susceptible to the formation of holes therein which can create short circuits between gate 36 and amorphous silicon layer 42 and consequently a conductive path may be created between scan line 16 and pixel electrode 34, which would adversely affect the operation of pixel 12.

Figure 6A:
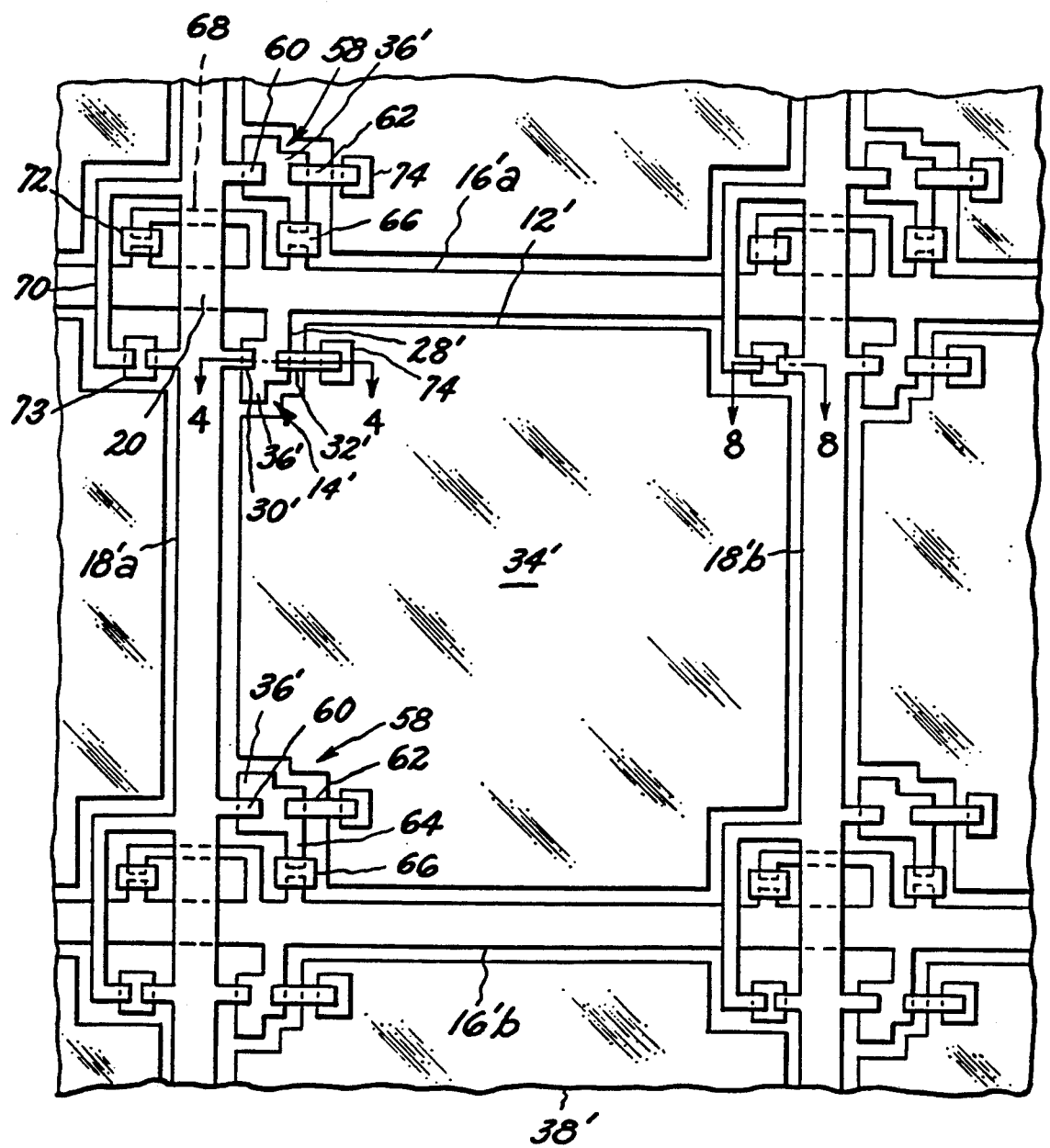
FIG. 6A is a detailed plan view of a portion of a liquid crystal display in accordance with one embodiment of the present invention.

In accordance with the present invention, a primary FET and an auxiliary FET are provided for alternatively controlling the operation of each pixel. Referring to FIG. 6A, a primary FET 14' has a gate electrode 28' normally connected to scan line 16'a. FET 14' has a source electrode 30', and a drain electrode 32', which are respectively connected to data line 18'a and pixel electrode 34'. An auxiliary FET 58 has a source electrode 60 which is preferably connected to the same data line 18'a as primary FET source electrode 30' and has a drain electrode 62 which is connected to pixel electrode 34'. Those skilled in the art will note that FET devices often exhibit symmetries in which the source and drain can be interchanged and that the source and drain designations exist only for convenience of explanation; such is the case with the present invention. A gate electrode 64 of auxiliary FET 58 is electrically isolated from scan line 16'b by a laser-fusible link 66. Gate electrode 64 is not connected to scan line 16'b unless needed (e.g., if primary FET 14' is defective). This prevents any adverse effects, such as reduced speed of operation, which might be caused by having a second FET always operational and connected to pixel electrode 34'. Furthermore, if both FETs are connected at all times and one is defective and adversely affecting operation of pixel 12', it may not always be possible to identify which FET is defective because the defect may not be visible through a microscope or be impossible of detection by other defect-detecting means. Therefore, there is some risk that the good FET will be cut out by disconnecting its gate from the scan line by laser evaporation to electrically isolate the supposedly defective FET.

If primary FET 14' is defective, and laser-fusible link 66 is activated, auxiliary FET 58 connected to the same pixel as primary FET 14' will be connected to scan line 16'b, which is the scan line immediately adjacent to scan line 16'a. This aspect of the present invention is not expected to be of any significant concern because, depending upon the display resolution desired, there will be as many as 100 to 200 pixels per inch of display area and it will not matter that auxiliary FET 58 is controlled by a different scan line from primary FET 14'. Gate electrode 64 of auxiliary FET 58 could equally have been connected to scan line 16'a by extending a metal line from the gate metal of FET 58 toward scan line 16'a and by connecting this metal line to the scan line with a laser-fusible link; however, this arrangement would necessitate the patterning of a more complex photoresist mask, the deposition of more metal than is required with the layout shown in FIG. 6A and, of most importance, the size of the display area will be reduced because of the additional metallization over that shown in FIG. 6A. Furthermore, since the metallization line that would be required to connect the FET 58 to scan line 16'a is greater than the line required to connect FET 58 to scan line 16'b, the probability of a defect such as an open or short circuit will increase with the longer line.

Auxiliary FET 58 could equally be located at other locations within liquid crystal cell 26' but factors such as reduction of display area, fabrication compatibility and simplicity and increased probability of defects must be considered with regard to FET placement.

Figure 6B:
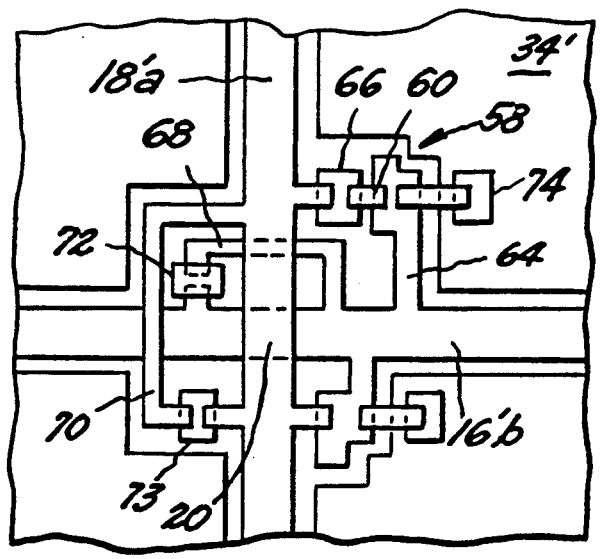
FIG. 6B is a detailed plan view of a portion of a liquid crystal display in accordance with another embodiment of the present invention.
Figure 6C:
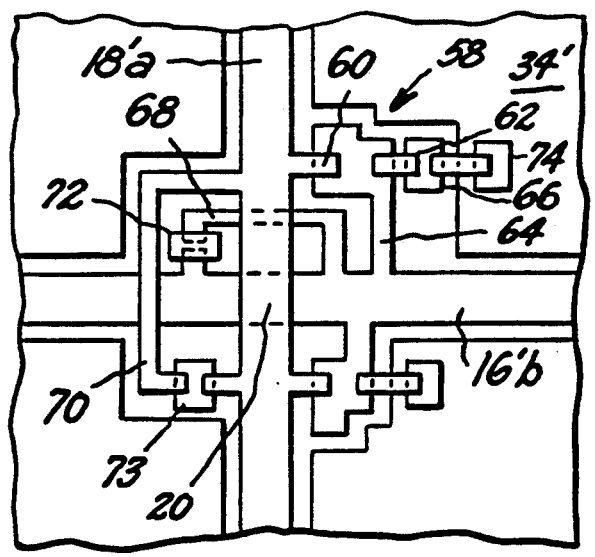
FIG. 6C is a detailed plan view of a portion of a liquid crystal display in accordance with a further embodiment of the present invention.

Laser-fusible link 66 could also have been located between source electrode 60 and data line 18'a (FIG. 6B) or between drain electrode 62 and pixel electrode 34' (FIG. 6C) and still accomplish the objectives of the present invention. Laser-fusible link 66 is presently thought to be best located between gate electrode 64 and scan line 16'b (FIG. 6A) to minimize scan line capacity and for ease of fabrication and maximization of display area. Details of the laser-fusible link structure and method for activating the fusible link are discussed in detail hereinbelow.

In accordance with another aspect of the present invention, redundant crossovers 68 are provided for scan lines 16' and redundant crossovers 70 are provided for data lines 18' to bypass a defective crossover 20 (FIGS. 6A-6C) in which a short-circuit may be present between scan line 16' and data lines 18', by the formation of holes in silicon nitride layer 22 (see FIG. 2). Redundant crossovers 68 and 70 each include a laser-fusible link 72 and 73, respectively, connected in a conductive strip which shunts crossover 20. Therefore, crossovers 68 and 70 are normally open circuits, so as not to adversely affect the operation of the liquid crystal display, unless needed because of a defective crossover 20. If crossover 20 becomes defective, the laser-fusible links 72 and 73 may be respectively activated to close redundant crossovers 68 and 70. Crossover 20 may then be electrically disconnected from the liquid crystal display by severing scan line 16'a and data line 18'a by laser evaporation at locations within the connection points, on either side of crossover 20, where the redundant crossovers connect to the data and scan lines. The width of the redundant crossover metallization should be less than about 5 microns, preferably about 3 microns. While the metallization pattern of redundant crossovers 68 and 70 is shown in FIG. 6A to be substantially rectangular in shape, other geometries and line sizes could be utilized as well within the constraints of maximizing the display area, minimizing metallization, keeping line resistance low, maintaining fabrication compatibility and simplicity and reducing the probability of defects such as opens and shorts.

Figure 7C:
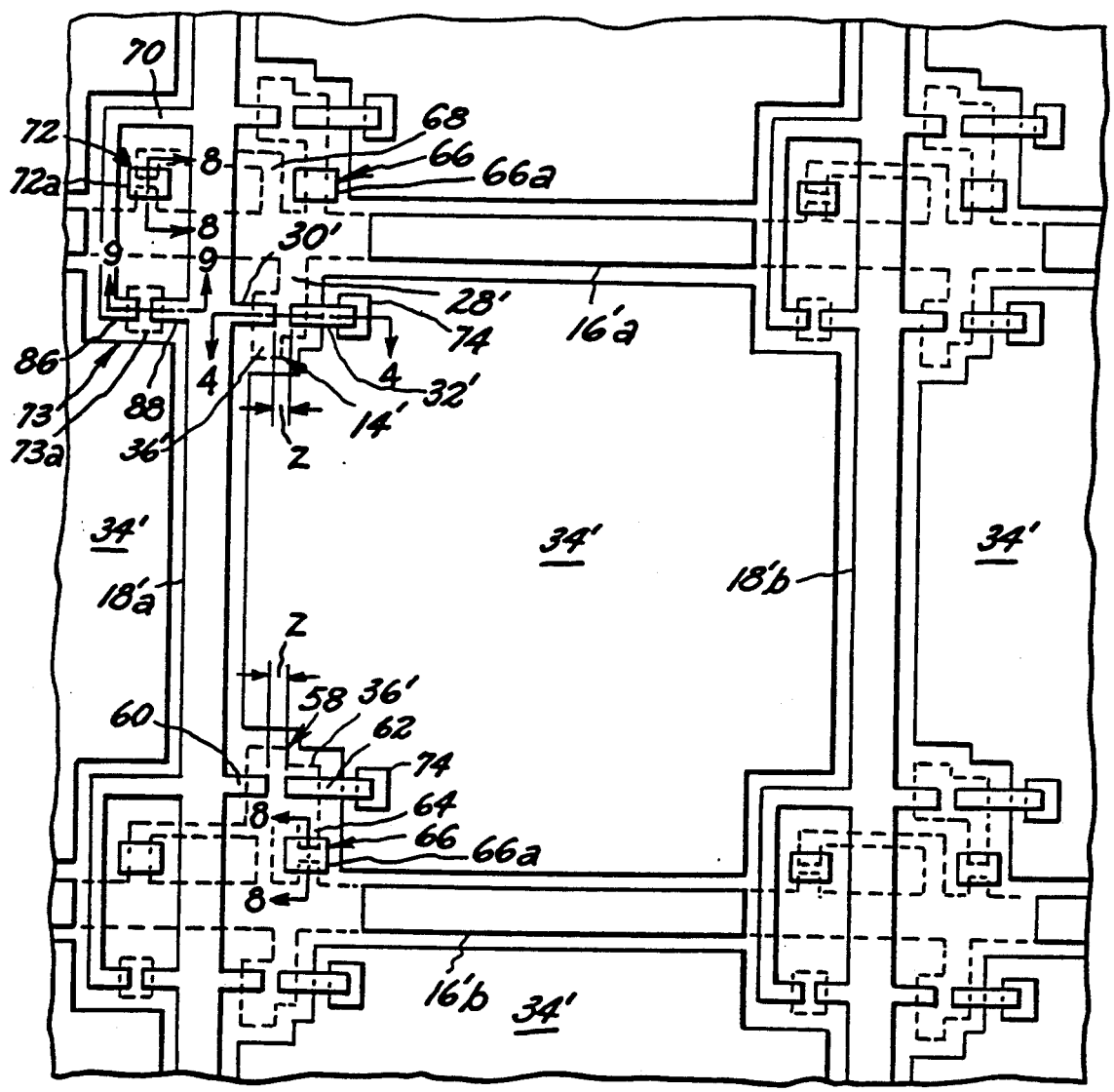

FIGS. 7A-7C illustrate the fabrication steps for forming the liquid crystal display portion of FIG. 6A. FIG. 7A illustrates a first metallization pattern which forms the FET gate 36' and associated scan line lower level metallization 16"a and 16"b, when a redundant scan line conductor structure is used; such a structure is disclosed and claimed in U.S. Pat. No. 4,804,953, issued Feb. 14, 1989, and incorporated herein in its entirety by reference. The metallization pattern also includes the scan line redundant crossovers 68, metal portions 73a for laser-fusible links 73, and lower level data line metallization 18"a and 18"b (if a redundant data line conductor structure is employed). This metallization pattern is formed by sputtering a metal, preferably a refractory metal such as titanium (Ti), on an opaque substrate or on a glass substrate 38'. Metal pads 74 may also be deposited in contact with pixel electrode 34' to later facilitate electrical connection between the FET drain electrodes and pixel electrode 34'. Note that redundant crossovers 68 are segmented to form an open circuit between tabs 76 and 78 which will later form laser-fusible links 72 (FIG. 6A) as described in more detail below. Likewise, auxiliary FET gate electrode 64 is also segmented between tabs 76 and 78 which will later form laser-fusible link 66 (FIG. 6A) as described below. Tabs 76 extend from scan line metallization 16"a and 16"b and are integrally formed therewith. Tabs 78 extend from redundant crossovers 68 and from auxiliary FET gates 36' and are integrally formed therewith.

The metallization pattern of FIG. 7A is preferable about 2000 angstroms thick. A thinner metallization pattern could be utilized but not without some increase in resistance of the scan and data lines; such additional resistance is particularly undesirable in larger displays. Also, the metallization pattern could be made thicker but then there is a risk of step coverage problems when subsequent layers of materials are deposited over the first metallization pattern. Additionally, if a redundant conductor structure is used for the scan and data lines, the scan and data line metal first deposited or the lowermost conductive scan and data line portions may be as wide as 5-6 microns or at least sufficiently wide so that subsequently deposited uppermost conductive scan and data line portions may electrically contact the lowermost conductive line portions along either side of a narrow insulating strip which will be deposited between the lower and upper scan and data metal line portions as described below.

Gate 36' metallization is preferably about 9 microns wide at the widest location indicated by dimension "W" in FIG. 7A. The distance between adjacent data lines 18"a and 18"b, indicated by dimension "X" (FIG. 7A), is about 0.10 mm and the distance between adjacent scan lines 16"a and 16"b indicated by dimension "Y" (FIG. 7A) is also about 0.10 mm. After deposition and patterning of the first metallization pattern, a layer of insulation 40', preferably silicon nitride (SiN) is deposited by PECVD and patterned to form the area bounded within the heavy line 75 in FIG. 7B. Insulation layer 40' may be about 500-1500 angstroms thick, and preferably about 1500 angstroms thick; a layer thicker than about 1500 angstroms will increase the voltage required to "turn-on" the FETs and a layer thinner than about 1500 angstroms increases the probability of defects (such as short-circuits and the like) within the FETs or between the scan and data lines at crossovers 20. Those portions of the metallization pattern of FIG. 7A which underlie insulation layer 40' are shown by a broken line in FIG. 7B. Insulation layer 40' has insulation portions 80 extending outwardly from a central patch region 84 for partially covering data line lower level metallization 18"a and 18"b and also has insulation portions 82 extending outwardly from central patch region 84 for partially covering scan line lower level metallization 16"a and 16"b. Region 84 provides the FET gate insulation and the scan and data line crossover insulation. Portion 80 provides an intermediate layer between the lower level data line metal 18"a and 18"b and the upper level data line metal 18'a and 18'b which will be subsequently deposited. Portions 82 provide an intermediate insulation layer between lower level scan line metal 16"a and 16"b and upper level scan line metal 16'a and 16'b which will be subsequently deposited. These intermediate insulation layers permit the upper level metallization to be formed without step jumps (which can create open circuits in the scan and data lines). It is noted that insulation portions 80 and 82 should be narrower than the lower level scan and data line metallization so that the upper level scan and data line metallization can contact the lower level metal on either side of portions 80 and 82.

A first layer 42' of semiconductor material, preferably amorphous silicon (a-Si), is deposited to a thickness of about 2,000 angstroms on insulative layer 40' and may be formed in the same pattern as layer 40' (FIG. 7B). First layer 42' may also be deposited only on central patch region 84 and not on insulation portions 80 and 82. A second layer 44' of semiconductor material, preferably a-Si, is formed on first layer 42' and is doped to have a particular conductivity (either N or P). Second layer 44' is preferably about 500 angstroms thick. Doped layer 44' may also be formed in the same pattern as first layer 42' and insulation layer 40'.

A second layer of metallization, preferably of molybdenum, is deposited on layer 44' and patterned as shown in FIG. 7C. The first metallization pattern underlying insulation layer 40' is shown by broken lines. The second metallization pattern includes data lines 18'a and 18'b upper level metal, scan lines 16'a and 16'b upper level metal, redundant crossover 70 metallization, primary FET source electrode 30' metallization and auxiliary FET source electrode 60 metallization, both of which are integrally formed with data line 18'a metallization. The second metallization pattern further includes primary FET drain electrode 32' metallization, auxiliary FET drain electrode 62 metallization, fusible-link portion 72a of laser-fusible link 72 for connecting tabs 76 and 78 (FIG. 7A) of redundant crossover 68 (shown by a broken line in FIG. 7C) and fusible-link portion 66a of laser-fusible link 66 for connecting tabs 76 and 78 (FIG. 7A), which will connect gate electrode 64 of FET 58 to scan line 16'b lower level metallization 16"b. It should be noted that redundant crossover 70 is segmented to form an open circuit between tabs 86 and 88 which form laser-fusible link 73 with metal portion 73a (shown in broken line in FIG. 7C). Tab 86 extends from redundant crossover 70 and is integrally formed therewith. Tab 88 extends from data line 18'a upper level metallization and is integrally formed therewith. Activation of laser-fusible links 66, 72 and 73 are described hereinbelow.

The second metallization layer has a thickness of about 1,000-10,000 angstroms, preferably about 4,000 angstroms for a matrix display ranging from about 600×600 pixels to about 1,200×1,200 pixels. This thickness should provide sufficient step coverage and conductivity for displays of this size. The doped amorphous silicon layer 44' and amorphous silicon layer 42' are anisotropically etched through a mask formed by the second metallization layer of FIG. 7C. Thus, layers 42' and 44' are patterned similar to the second metallization layer; source regions 44'a (not shown) similar to source region 44a in FIG. 4 are thus formed beneath source electrode metallization patterns 30' and 60 and drain regions 44'b (not shown) similar to drain region 44b in FIG. 4 are formed beneath drain electrode metallization patterns 32' and 62. The distance between the source electrode 30' and drain electrode 32' of FET 14' and between source electrode 60 and drain electrode 62 of FET 58, indicated by dimension "Z" (FIG. 7C), is less than about 5 microns, preferably about 3 microns.

A similar structure is used for laser-fusible link 72, for redundant crossover 68, and in laser-fusible link 66, for connecting gate electrode 64 of auxiliary FET 58 to scan line 16'b lower level metal 16"b, as shown by the cross-sectional view of FIG. 8A. Tabs 76 and 78 are formed with the first metallization pattern (FIG. 7A) and create an open circuit because of a discontinuity 90 between the tabs. Tabs 76 and 78 are preferably titanium. As previously discussed a layer 40' of insulation (preferably SiN) is deposited which covers discontinuity 90. A layer 42' of amorphous silicon is then deposited on layer 40'; later, a thin layer 44' of doped amorphous silicon is formed on layer 42'. Laser-fusible link portions 66a and 72a are formed with the second metallization pattern (FIG. 7C) and partially overlie tabs 76 and 78. Link portions 66a and 72a are preferably molybdenum. Referring to FIG. 8B, laser-fusible links 68 or 72 is activated when laser light pulses (represented by arrows 92 in FIG. 8A) are incident onto link portion 66a/72a at locations directly over tabs 76 and 78. A catastrophic event occurs, similar to a mini-explosion, and the molecules of tabs 76 and 78 randomly intersperse with the molecules of metal link portion 66a/72a within layers 40', 42' and 44' in a region below where the laser light pulses 92 were incident. In this manner, an electrical path is created between tabs 76 and 78.

FIG. 8C shows a laser-fusible link 66'/72' in accordance with an alternate embodiment of the present invention. In this embodiment, insulation layer 40" and amorphous silicon layers 42" and 44" are patterned so that at least a portion of either tab 76' (or 78') is exposed. Metal portion 66'a/72'a will then directly contact the exposed portion of tab 76' (or 78') when portion 66'a/72'a is deposited. To activate this link, only a single laser pulse 92' will be incident at a location where portion 66'a/72'a partially overlies layers 40", 42" and 44" and the unexposed tab 78' (or 76'). As previously discussed, a catastrophic event occurs when the laser pulse strikes portion 66'a/72'a and the molecules of metal tab 78' will intersperse with the molecules of link portion 66'a/72'a to create an electrical path between tabs 76' and 78' as shown in FIG. 8D.

Figure 9A:
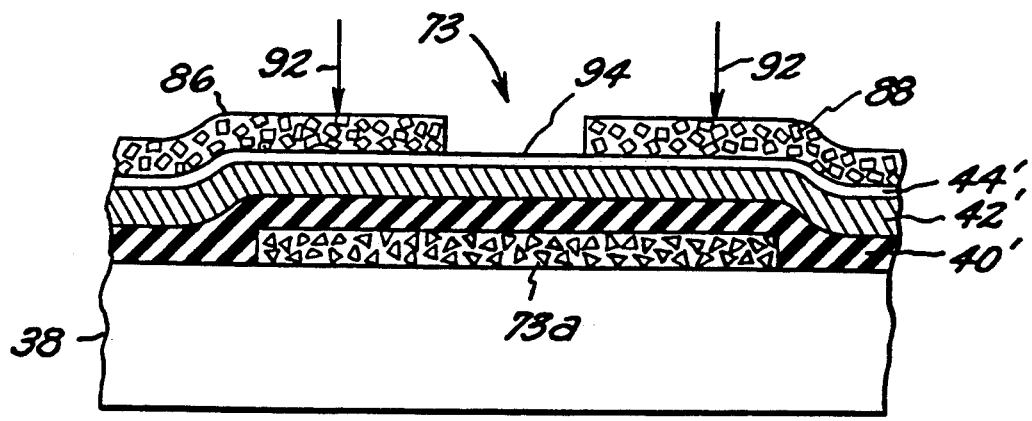
FIG. 9A is a cross-sectional view of a laser-fusible link of FIG. 7C taken along lines 9—9.
Figure 9B:
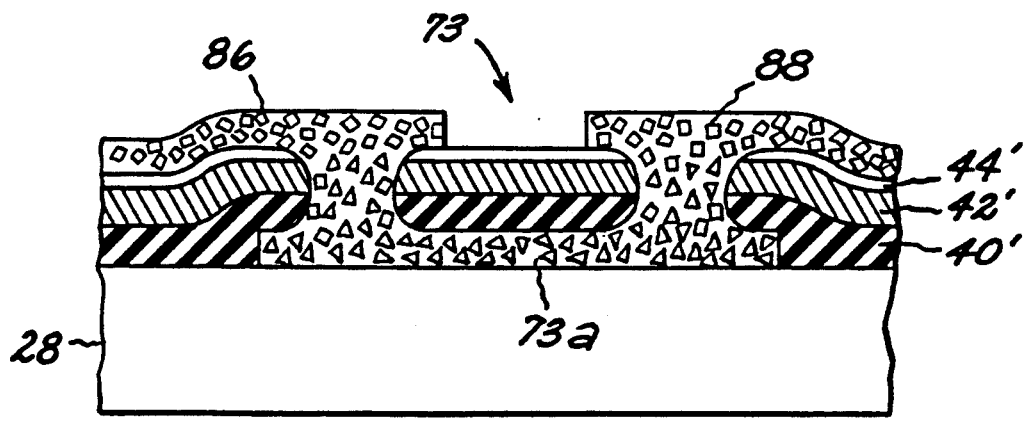
FIG. 9B is a cross-sectional view of a laser-fusible link of FIG. 9A after treatment by a laser light pulse.

A cross-sectional view of laser-fusible link 73 for redundant crossover 70 is shown in FIG. 9A. Link portion 73a is formed as part of the first metallization layer (FIG. 7A) and is preferably titanium. Tabs 86 and 88 are formed as part of the second metallization layer and create an open circuit because of a discontinuity 94 between tabs 86 and 88. Tabs 86 and 88 are molybdenum and are deposited so as to partially overlie titanium portion 73a. Referring to FIG. 9B, laser-fusible link 73 is activated when laser light pulses (represented by arrows 92 in FIG. 9A) are incident onto tabs 86 and 88 at locations where tabs 86 and 88 overlie link portion 73a. A catastrophic event occurs to intersperse the metal molecules of link portion 73a with the metal molecules of tabs 86 and 88, respectively, within layers 40', 42' and 44' in a region below where laser light pulses 92 were incident. In this manner, an electrical path is created between tabs 86 and 88. Laser-fusible link 73 could also be structured analogously to the alternate embodiment of FIG. 8C, with one of tab 86 or 88 deposited in contact with portion 73a and the other of tab 86 and 88 being disposed over layers 40', 42' and 44'. Then only a single laser light pulse will be required to activate the laser-fusible link. The energy level and the duration of the laser light pulse will be a function of the thicknesses of the layers making up the laser-fusible link; however, for the preferred thicknesses indicated, a pulse of 1 microsecond from a pulsed Xenon laser with an energy per pulse of 0.1 millijoules for each location of incidence has been found to be suitable.

It will be readily understood by those skilled in the art that the present invention is not limited to the specific embodiments described and illustrated herein. Different embodiments and adaptations besides those shown herein and described, as well as many variations, modifications, and equivalent arrangements will now be apparent or will be reasonably suggested by the foregoing specification and drawings, without departing from the substance or scope of the invention. While the pixel cells were illustrated in the figures to be substantially square shaped, other geometric sizes and shapes could be utilized as well. Likewise, while the data lines and scan lines were shown to extend in substantially vertical and horizontal directions, it is also possible to employ data lines or scan lines so as to more closely resemble an oblique coordinate system. While the present invention has been described herein in detail in relation to its preferred embodiments, it is to be understood that this disclosure is only illustrative and exemplary of the present invention and is made merely for purposes of providing a full and enabling disclosure of the invention. Accordingly, it is intended that the invention be limited only by the spirit and scope of the claims appended hereto.

What is claimed is:

1. A liquid crystal display, comprising:
   a plurality of cells arranged substantially in rows and columns;
   a plurality of electrically conductive scan lines formed from a first electrically conductive layer, at least one scan line for transmitting electrical signals to each row of cells;
   a plurality of electrically conductive data lines formed from a second electrically conductive layer, at least one data line for transmitting electrical signals to each column of cells, each scan line crossing each data line at a different crossover location at which that scan line is insulatively spaced from the data line to be crossed by at least a first section of insulation material;
   each of said plurality of cells comprising:
   (a) a pixel electrode;
   (b) a primary switching means for transferring electrical signals to said pixel electrode, from one selected combination of a scan line of said plurality of scan lines and a data line of said plurality of data lines, for conversion to a visual signal;
   (c) at least one auxiliary switching means for transferring electrical signals to said pixel electrode from another selected combination of either said scan line of said one selected combination and a data line adjacent to said data line of said one selected combination or said data line of said one selected combination and a scan line adjacent to said scan line of said one selected combination when said primary switching means is incapable of transferring signals, said auxiliary switching means having, when said primary switching means is configured to transfer signals, an open circuit between it and at least one of said pixel electrode and said other selected combination of data line and scan line; and
   (d) means for closing, when said primary switching means is not configured to transfer signals, the open circuit between said auxiliary switching means and at least one of said pixel electrode and said other selected combination of data line and scan line;
   and at least one redundant scan line crossover means formed from at least a portion of said first conductive layer each located at a different one of said crossover locations, for electrically bypassing that one crossover location when an associated one of said plurality of scan lines is electrically shorted to an associated one of said plurality of data lines and said one of said plurality of scan lines has been severed at a location encompassed by said redundant scan line crossover means.

2. The liquid crystal display of claim 1, wherein each of said redundant scan line crossover means comprises a conductive strip connected to said one scan line at a first location on one side of the associated crossover location and connectable to said one scan line by a laser-fusible link at a second location on another side of that crossover location to cause said redundant scan line crossover means to be disconnected from the second location unless said laser-fusible link is completed.

3. A liquid crystal display, comprising:
   a plurality of cells arranged substantially in rows and columns;
   a plurality of electrically conductive scan lines formed from a first electrically conductive layer, at least one scan line for transmitting electrical signals to each row of cells;
   a plurality of electrically conductive data lines formed from a second electrically conductive layer, at least one data line for transmitting electrical signals to each column of cells, each scan line crossing each data line at a different crossover location at which that scan line is insulatively spaced from the data line to be crossed by at least a first section of insulation material;
   each of said plurality of cells comprising:
   (a) a pixel electrode;
   (b) a primary switching means for transferring electrical signals to said pixel electrode, from one selected combination of a scan line of said plurality of scan lines and a data line of said plurality of data lines, for conversion to a visual signal;
   (c) at least one auxiliary switching means for transferring electrical signals to said pixel electrode from another selected combination of either said scan line of said one selected combination and a data line adjacent to said data line of said one selected combination or said data line of said one selected combination and a scan line adjacent to said scan line of said one selected combination when said primary switching means is incapable of transferring signals, said auxiliary switching means having, when said primary switching means is configured to transfer signals, an open circuit between it and at least one of said pixel electrode and said other selected combination of data line and scan line; and
   (d) means for closing, when said primary switching means is not configured to transfer signals, the open circuit between said auxiliary switching means and at least one of said pixel electrode and said other selected combination of data line and scan line; and
   at last one redundant data line crossover means formed from at least a portion of said second conductive layer, each located at a different one of said crossover locations, for electrically bypassing that one crossover location when an associated one of said plurality of scan lines is electrically shorted to an associated one of said plurality of data lines and said one of said plurality of data lines has been severed at a location encompassed by said redundant data line crossover means.

4. The liquid crystal display of claim 3, wherein each of said redundant data line crossover means comprises a conductive strip connected to said one data line at a first location on one side of the associated crossover location and connectable to said one data line by a laser-fusible link at a second location on another side of that crossover location to cause said redundant data line crossover means to be disconnected from the second location unless said laser-fusible link is completed.

5. A liquid crystal display, comprising:
a plurality of cells arranged in an array of rows and columns;
a plurality of electrically conductive scan lines formed from a first electrically conductive layer, at least one scan line for transmitting electrical signals to each row of cells;
a plurality of electrically conductive data lines formed from a second electrically conductive layer, at least one data line for transmitting electrical signals to each column of cells, each scan line crossing each data line at a different crossover location at which that scan line is insulatively spaced from the data line to be crossed by at least a first section of insulation material;
at least one redundant scan line crossover means formed from at least a portion of said first conductive layer, each located at a different one of said crossover locations, for electrically bypassing that one crossover location when an associated one of said plurality of scan lines is electrically aborted to an associated one of said plurality of data lines at that one crossover location and said one of said plurality of scan lines has been severed at a location encompassed by said redundant scan line crossover means; and
at least one redundant data line crossover means formed from at least a portion of said second conductive layer, each located at a different one of said crossover locations, for electrically bypassing that one crossover location when an associated one of said plurality of scan lines is electrically shorted to an associated one of said plurality of data lines at that one crossover location and said one of said plurality of data lines has been severed at a location encompassed by said redundant data line crossover means.

6. The liquid crystal display of claim 5, wherein each of said redundant scan line crossover means and each of said redundant data line crossover means comprise a conductive strip respectively connected to said one scan line at a first location and to said one data line at a first location, both of said first locations being on one side of the associated crossover location, and each crossover means connectable respectively to said one scan line and to said one data line by a laser-fusible link at a second location on each of said one scan line and said one data line, both of said second locations being on another side of that crossover location to cause both of said redundant data line crossover means and said redundant scan line crossover means to be disconnected from their respective second locations unless said laser-fusible link is completed.

7. The liquid crystal display of claim 5 wherein each of said plurality of cells comprises:
a pixel electrode;
a primary switching means for transferring electrical signals to said pixel electrode from one selected combination of said plurality of scan lines and said plurality of data lines, for conversion to a visual signal;
at least one auxiliary switching means for transferring electrical signals to said pixel electrode from another selected combination of said plurality of scan lines and said plurality of data lines when said primary switching means is incapable of transferring signals, said auxiliary switching means having, when said primary switching means is configured to transfer signals, an open circuit between it and at least one of said pixel electrode and said other selected combination data line and scan line; and
means for closing, when said primary switching means is capable of transferring signals, the open circuit between said auxiliary switching means and at least one of said pixel electrode and said other selected combination data line and scan line.

8. The liquid crystal display of claim 7, wherein said primary switching means and said auxiliary switching means are each a thin-film field-effect transistor (FET), said primary FET having a gate electrode connected to a scan line of said one selected combination, a source electrode connected to a data line of said one selected combination and a drain electrode connected to said pixel electrode.

9. The liquid crystal display of claim 8, wherein said auxiliary FET has a source electrode connected to a data line of said other selected combination, a drain electrode connected to said pixel electrode and a gate electrode electrically isolated from a scan line of said other selected combination when said primary FET is configured to transfer electrical signals and connectable to said other selected combination scan line by said connecting means when said primary FET is incapable of transferring signals.

10. The liquid crystal display of claim 9, wherein said connecting means is a laser-fusible link.

11. A liquid crystal display, comprising:
a plurality of cells arranged in an array of rows and columns;
a plurality of electrically conductive scan lines formed from a first electrically conductive layer, at least one scan line for transmitting electrical signals to each row of cells;
a plurality of electrically conductive data lines formed from a second electrically conductive layer, at least one data line for transmitting electrical signals to each column of cells, each scan line crossing each data line at a different crossover location at which that scan line is insulatively spaced from the data line to be crossed by at least a first section of insulation material;
each of said plurality of cells comprising:
(a) a pixel electrode;
(b) a primary switching means for transferring electrical signals to said pixel electrode, from a selected combination of said plurality of scan lines and said plurality of data lines, for conversion to a visual signal;
(c) at least one auxiliary switching means for transferring electrical signals to said pixel electrode from said selected combination of scan lines and data lines when said primary switching means is incapable of transferring signals, said auxiliary switching means having, when said primary switching means is configured to transfer signals, an open circuit between it and at least one of said pixel electrode and said selected combination of scan lines and data lines;
(d) means for closing, when said primary switching means is incapable of transferring signals, the open circuit between said auxiliary switching means and said at least one of said pixel electrode and said selected combination of scan lines and data lines; and
(e) at least one redundant scan line crossover means formed from at least a portion of said first conductive layer, each located at a different one of said crossover locations, for electrically bypassing that one crossover location when an associated one of said plurality of scan lines is electrically shorted to an associated one of said plurality of data lines at that one crossover location and said one of said plurality of scan lines has been severed at a location encompassed by said redundant scan line crossover means.

12. The liquid crystal display of claim 11, wherein each of said redundant scan line crossover means comprises a conductive strip connected to said one scan line at a first location on one side of the associated crossover location and connectable to said one scan line by a laser-fusible link at a second location on another side of that crossover location to cause said redundant scan line crossover means to be disconnected from the second location unless said laser-fusible link is completed.

13. A liquid crystal display, comprising:
a plurality of cells arranged in an array of rows and columns;
a plurality of electrically conductive scan lines formed from a first electrically conductive layer, at least one scan line for transmitting electrical signals to each row of cells;
a plurality of electrically conductive data lines formed from a second electrically conductive layer, at least one data line for transmitting electrical signals to each column of cells, each scan line crossing each data line at a different crossover location at which that scan line is insulatively spaced from the data line to be crossed by at least a first section of insulation material;
each of said plurality of cells comprising:
(a) a pixel electrode;
(b) a primary switching means for transferring electrical signals to said pixel electrode, from a selected combination of said plurality of scan lines and said plurality of data lines, for conversion to a visual signal;
(c) at least one auxiliary switching means for transferring electrical signals to said pixel electrode from said selected combination of scan lines and data lines when said primary switching means is incapable of transferring signals, said auxiliary switching means having, when said primary switching means is configured to transfer signals, an open circuit between it and at least one of said pixel electrode and said selected combination of scan lines and data lines; and
(d) means for closing, when said primary switching means is incapable of transferring signals, the open circuit between said auxiliary switching means and said at least one of said pixel electrode and said selected combination of scan lines and data lines;
(e) at least one redundant data line crossover means formed from at least a portion of said second conductive layer, each located at a different one of said crossover locations, for electrically bypassing that one crossover location when an associated one of said plurality of scan lines is electrically shorted to an associated one of said plurality of data lines at that crossover location and said one of said plurality of data lines has been severed at a location encompassed by said redundant data line crossover means.

14. The liquid crystal display of claim 13, wherein each of said redundant data line crossover means comprises a conductive strip connected to said one data line at a first location on one side of the associated crossover location and connectable to said one data line by a laser-fusible link at a second location on another side of that crossover location to cause said redundant data line crossover means to be disconnected from the second location unless said laser-fusible link is completed.

* * * * *